United States Patent
Tu et al.

(10) Patent No.: US 8,390,087 B2
(45) Date of Patent: Mar. 5, 2013

(54) IMAGE SENSOR PACKAGE STRUCTURE WITH LARGE AIR CAVITY

(75) Inventors: Hsiu-Wen Tu, Hsin-Chu Hsien (TW);
Ren-Long Kuo, Hsin-Chu Hsien (TW);
Young-Houng Shiao, Hsin-Chu Hsien (TW); Tsao-Pin Chen, Hsin-Chu Hsien (TW); Mon-Nam Ho, Hsin-Chu Hsien (TW); Chih-Cheng Hsu, Hsin-Chu Hsien (TW); Chin-Fu Lin, Hsin-Chu Hsien (TW); Chung-Hsien Hsin, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 334 days.

(21) Appl. No.: 12/683,546

(22) Filed: Jan. 7, 2010

(65) Prior Publication Data

US 2011/0024862 A1  Feb. 3, 2011

Related U.S. Application Data

(60) Provisional application No. 61/229,367, filed on Jul. 29, 2009.

(51) Int. Cl.
*H01L 31/0203* (2006.01)

(52) U.S. Cl. ............. 257/434; 257/E31.117

(58) Field of Classification Search ............. 257/434, 257/E31.117
See application file for complete search history.

(56) References Cited

U.S. PATENT DOCUMENTS

| 5,023,163 | A  | * | 6/1991 | Simizu et al. | 430/207 |
| 5,880,777 | A  | * | 3/1999 | Savoye et al. | 348/217.1 |
| 2005/0184404 | A1 | * | 8/2005 | Huang et al. | 257/787 |

* cited by examiner

*Primary Examiner* — Calvin Lee
*Assistant Examiner* — Monica D Harrison
(74) *Attorney, Agent, or Firm* — Stites & Harbison, PLLC; Juan Carlos A. Marquez, Esq.

(57) ABSTRACT

The present invention discloses an image sensor package structure with a large air cavity. The image sensor package structure includes a substrate, a chip, a cover and a package material. The chip is combined with the substrate. A plastic sheet of the cover is adhered to the chip and a transparent lid of the cover is combined with the plastic sheet to provide a covering over a sensitization area of the chip so as to form an air cavity. The package material is arranged on the substrate and encapsulated around the chip and the cover. The plastic sheet having a predetermined thickness can increase the distance between the transparent lid and the chip to enlarge the air cavity. Thus, the image-sensing effect of the image sensor package structure can be improved and the ghost image problem resulting from multi-refraction and multi-reflection of light can be minimized.

13 Claims, 8 Drawing Sheets

IMAGE SENSOR PACKAGE STRUCTURE WITH LARGE AIR CAVITY

BACKGROUND OF THE INVENTION

1. Technical Field

The present invention relates to image sensor package structures. More particularly, the present invention relates to an image sensor package structure with a large air cavity, wherein the image sensor package structure provides an improved image-sensing effect.

2. Description of Related Art

With the ongoing progress of technology, all manufacturers of electronic multimedia devices have made every effort to improve functionality and performance of their products with the attempt to meet all the consumer demands related to audio and/or video entertainments. In such popular electronic multimedia devices, image sensors play a critical role. An image sensor serves to receive and convert optical signals into electrical signals, and transmit the electrical signals to an external device that analyzes the electrical signals. When incorporated in an electronic device, the image sensor enables the electronic device to take still and/or dynamic images.

A conventional image sensor package is mainly constructed by placing an image sensor chip on a substrate, and electrically connecting the two with metal conducting wires, so that a signal connection between the image sensor chip and the substrate can be established. Next, a transparent lid (e.g. glass), which allows light to pass through and be captured by the image sensor chip, is settled above the image sensor chip, thereby completing the package structure. Such an image sensor package structure may be later integrated with an external device, such as a PCB, to be used in various electronic products such as a DSC (Digital Still Camera), a DV (Digital Video), a security monitoring system, a mobile phone, and a vehicle image sensing module.

In addition to the adaptability to mass manufacturing, another important factor to evaluate an image sensor is its image-sensing performance. Traditionally in downsizing an image sensor, it is the general approach to adhere the transparent lid right on top of the image sensor chip, resulting in a very short distance between the transparent lid and the image sensor chip. As a result, when light passes through the transparent lid and enters into the sensitization area of the image sensor chip, the multi-refraction or multi-reflection of light is likely to occur, leading to poor imaging quality as well as ghost images.

SUMMARY OF THE INVENTION

The present invention provides an image sensor package structure with a large air cavity, wherein a plastic sheet is additionally provided between a transparent lid and a chip, so that the distance between the transparent lid and the chip is enlarged, bringing an improved image-sensing effect of the image sensor package structure.

The present invention provides an image sensor package structure with a large air cavity, wherein a transparent lid and a plastic sheet are bound together by means of injection molding, thereby simplifying the manufacturing process of the image sensor package structure.

The present invention provides an image sensor package structure with a large air cavity, wherein the package material is combined with a transparent lid to cover a periphery of the upper surface of the transparent lid, thereby extending the blockage area from moisture to the chip, and ensuring the image-sensing effect of the image sensor package structure against moisture.

To achieve these and other effects, the image sensor package structure with the large air cavity of the present invention comprises: a substrate, having a first surface and a second surface, wherein the first surface is formed with a plurality of first conductive contacts; a chip, having a third surface bound with the first surface, a fourth surface including a sensitization area, and a plurality of second conductive contacts, which surround the sensitization area and are electrically connected with the first conductive contacts; a cover, having a plastic sheet adhered to the fourth surface, and a transparent lid, which is combined with the plastic sheet to provide a covering over the sensitization area and define the air cavity over the sensitization area; and a package material, deposited on the substrate to encapsulate peripheries of the chip and the cover.

By implementing the present invention, at least the following progressive effects can be achieved:

1. By enlarging the air cavity in volume and increasing the distance between the transparent lid and the chip, the improved imaging quality of the image sensor package structure can be achieved.

2. Since the transparent lid and the plastic sheet are combined by means of injection molding, the manufacturing process can be simplified and the manufacturing cost can be therefore reduced.

3. By covering the periphery of the upper surface of the transparent lid with the package material, the blockage area from moisture to the chip is extended, thereby ensuring the image-sensing effect of the image sensor package structure against moisture.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

Figure 1A:
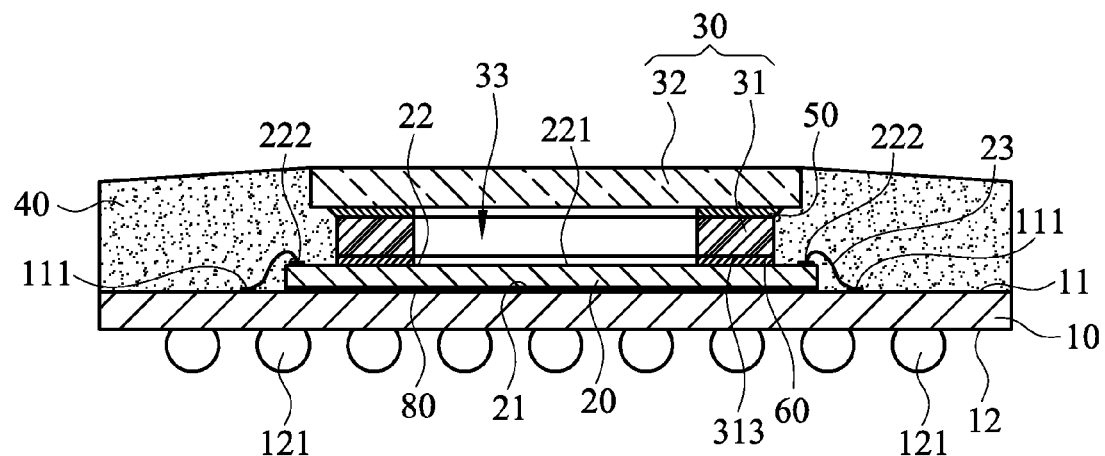
FIG. 1A is a sectional view of an image sensor package structure with a large air cavity according to a first embodiment of the present invention.

Please refer to FIG. 1A for an image sensor package structure with a large air cavity according to a first embodiment of the present invention. The image sensor package structure includes a substrate 10, a chip 20, a cover 30, and a package material 40.

As shown in FIG. 1A, the substrate 10 is one normally used in existing image sensor package structures, such as a circuit substrate. The substrate 10 has a first surface 11 and a second surface 12. Therein, the first surface 11 is an upper surface of the substrate 10 while the second surface 12 is a lower surface of the substrate 10. The first surface 11 of the substrate 10 is provided with a plurality of first conductive contacts 111 and the second surface 12 is arranged with a plurality of solder balls 121. By virtue of a circuit structure contained in the substrate 10, the first conductive contacts 111 and the solder balls 121 are electrically connected, so that the image sensor package structure can be further electrically connected with external circuit devices through the solder balls 121.

Referring to FIG. 1A, the chip 20 may be a CMOS (Complementary Metal Oxide Semiconductor) image sensor chip or a CCD (charge-coupled device) for sensing light. The chip 20 has a third surface 21 and a fourth surface 22, wherein the third surface 21 is a lower surface of the chip 20 while the fourth surface 22 is an upper surface of the chip 20. The third surface 21 of the chip 20 is combined with the first surface 11 of the substrate 10. In other words, the chip 20 is settled on the first surface 11 of the substrate 10. Furthermore, the chip 20 may be adhered to the first surface 11 of the substrate 10 through an adhesive 80.

Moreover, the fourth surface 22 of the chip 20 includes a sensitization area 221 and a plurality of second conductive contacts 222. Therein, the sensitization area 221 may be formed by a plurality of photosensitive elements and the second conductive contacts 222 are arranged to surround the sensitization area 221. The second conductive contacts 222 are electrically connected with the photosensitive elements, so that the second conductive contacts 222 on the chip 20 and the first conductive contacts 111 on the substrate 10 can be electrically connected through metal conducting wires 23 made by wiring, thereby establishing indirect electrical connection between the photosensitive elements and the solder balls 121.

Figure 2A:
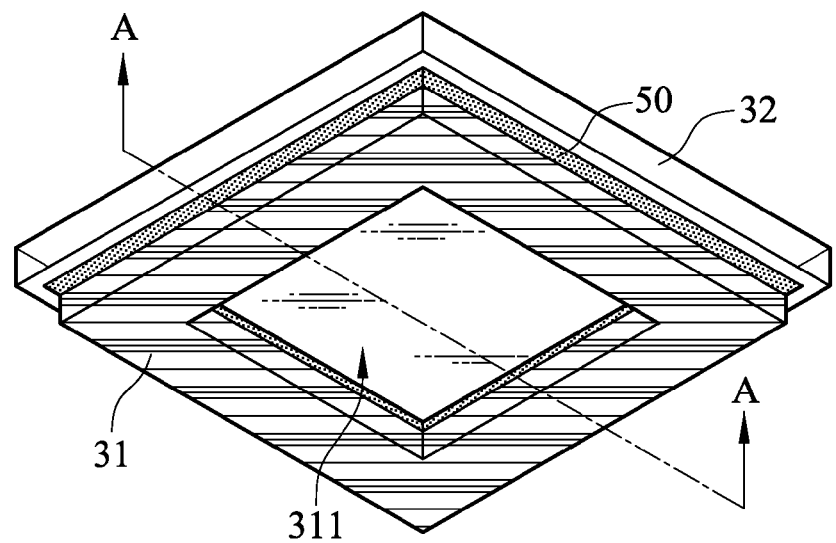
FIG. 2A is a schematic drawing showing a cover according to a first aspect of the present invention.
Figure 2B:
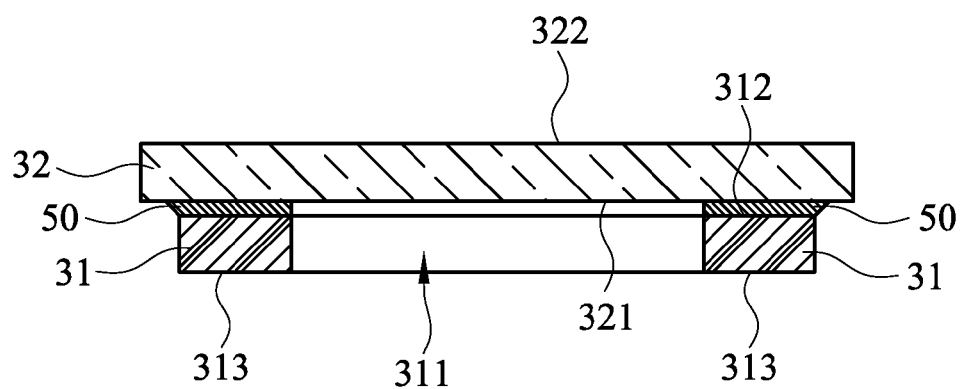
FIG. 2B is a sectional view taken along Line A-A of FIG. 2A.

As shown in FIGS. 2A and 2B, the cover 30 has a plastic sheet 31 and a transparent lid 32. Therein, the plastic sheet 31 may be made of liquid crystal polyester (LCP) or a heat-resistant plastic material, so as to be independent of high operational and ambient temperatures.

Referring to FIG. 2A, the plastic sheet 31 may be a frame and centrally formed with an opening 311 for allowing light to pass therethrough. Also seeing FIG. 2B, the plastic sheet 31 has a fifth surface 312 and a sixth surface 313 while the transparent lid 32 has a seventh surface 321 and an eighth surface 322. The fifth surface 312 of the plastic sheet 31 may be pre-adhered to the seventh surface 321 of the transparent lid 32 by a first adhesive 50 (such as epoxy resin) in a manner that the transparent lid 32 fully covers the opening 311 of the plastic sheet 31. In other words, the first adhesive 50 adheres the transparent lid 32 to the plastic sheet 31 to make a periphery of the transparent lid 32 jut out from the plastic sheet 31. Alternatively, the plastic sheet 31 and the transparent lid 32 may be combined by means of injection molding.

As shown in FIG. 1A, below the cover 30, the sixth surface 313 of the plastic sheet 31 is adhered to the fourth surface 22 of the chip 20 through a second adhesive 60 (such as epoxy resin). It is to be noted that the second adhesive 60 has to be arranged between the sensitization area 221 and the second conductive contacts 222 of the chip 20 without covering the sensitization area 221, so as to allow light passing through the transparent lid 32 to enter into the sensitization area 221 of the chip 20 by way of the opening 311 of the plastic sheet 31. Besides, since the second adhesive 60 is arranged along a periphery of the sensitization area 221, and is corresponding to the plastic sheet 31 in shape, it can firmly adhere the plastic sheet 31 to the fourth surface 22 of the chip 20, so that an air cavity 33 is defined by the transparent lid 32, the plastic sheet 31, and the chip 20.

In addition, since the plastic sheet 31 has a certain thickness, it props up the transparent lid 32 and acts as a barricade between the chip 20 and the transparent lid 32, so as to give a substantial distance between the transparent lid 32 and the sensitization area 221 of the chip 20, thereby expanding the air cavity 33 in volume. The enlarged air cavity 33 and increased distance between the transparent lid 32 and the chip 20 reduce the frequency of ghost images resulting from multi-refraction and multi-reflection of light that otherwise may be caused by an insufficient distance between the transparent lid 32 and the chip 20. Therefore the quality of the image-sensing effect of the image sensor package structure can be improved, especially in thinner image sensor package structure.

Figure 1B:
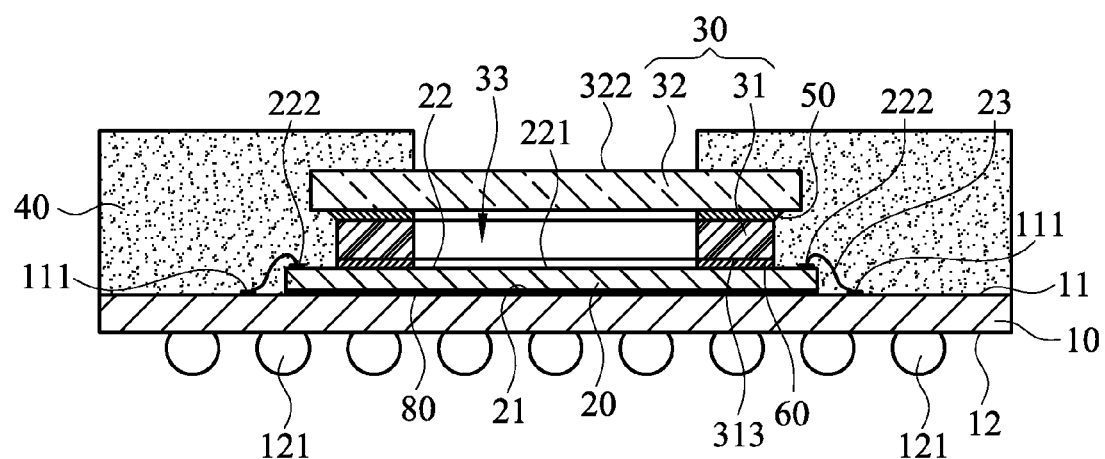
FIG. 1B is a sectional view of an image sensor package structure with a large air cavity according to a second embodiment of the present invention.

The package material 40 is applied to the substrate 10 through a coating or forming process so as to encapsulate around the chip 20, the plastic sheet 31, and the transparent lid 32, thus allowing the metal conducting wires 23 to be fully encapsulated by the package material 40, and accomplishing the image sensor package structure. The package material 40 may be applied to the substrate 10 by means of, but not limited to dispensing or molding. As can be seen in FIG. 1B, the package material 40 may further encapsulate around the eighth surface 322 of the transparent lid 32 so that the entire periphery of the upper surface of the transparent lid 32 are encapsulated by the package material 40. Consequently, an invasion path of moisture to the chip 20 is extended, and the image-sensing effect of the image sensor package structure can be ensured against moisture. In addition, the package material 40 may be a liquid compound or a mold compound.

Figure 3A:
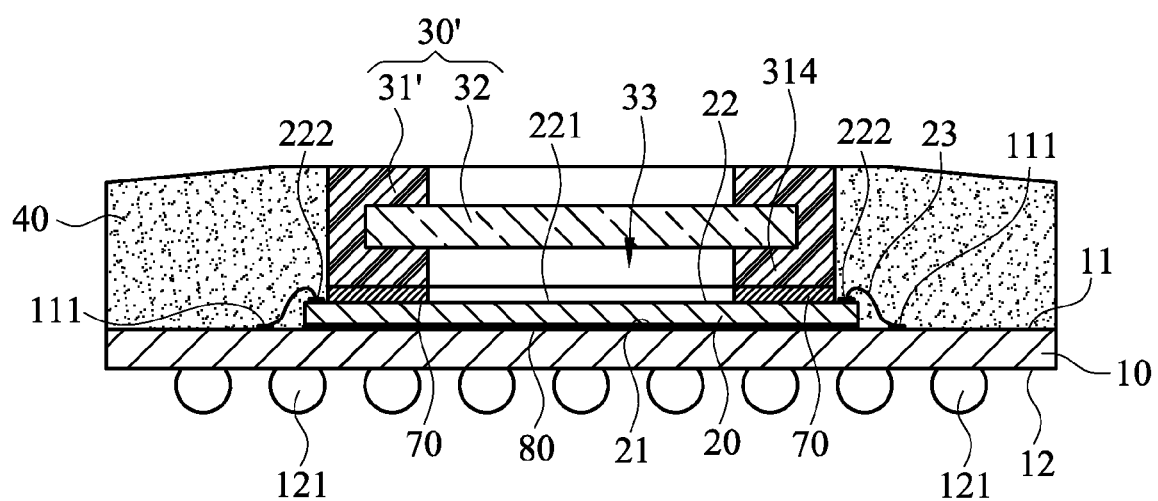
FIG. 3A is a sectional view of an image sensor package structure with a large air cavity according to a third embodiment of the present invention.
Figure 4A:
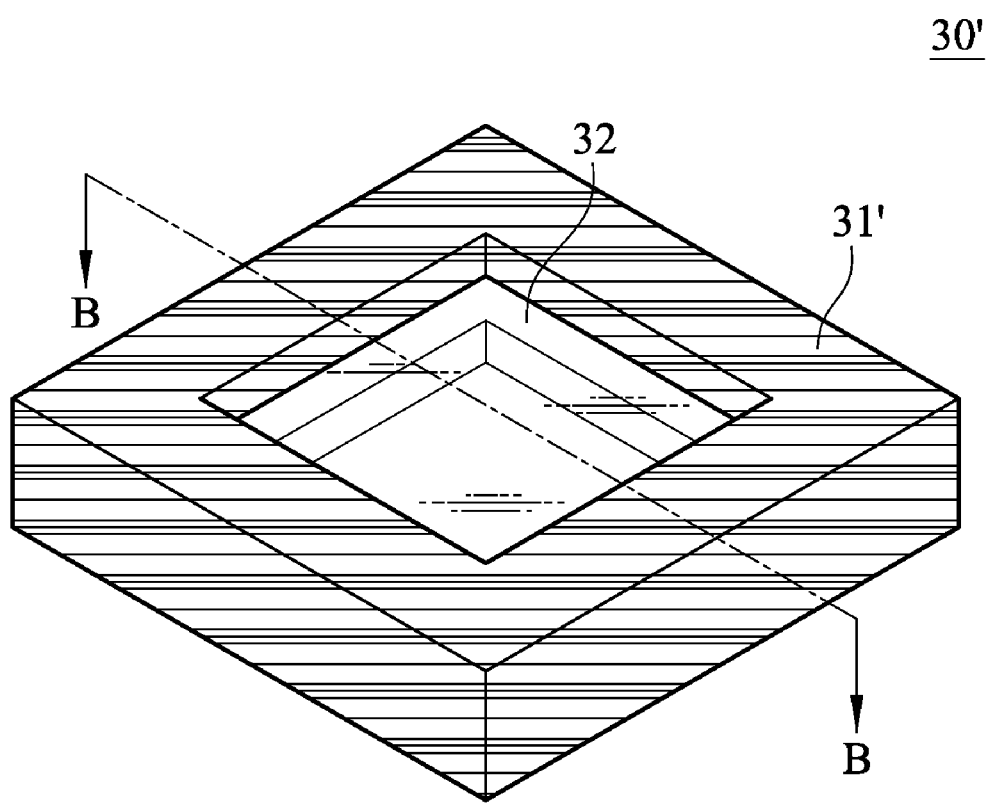
FIG. 4A is a schematic drawing showing a cover according to a second aspect of the present invention.
Figure 4B:
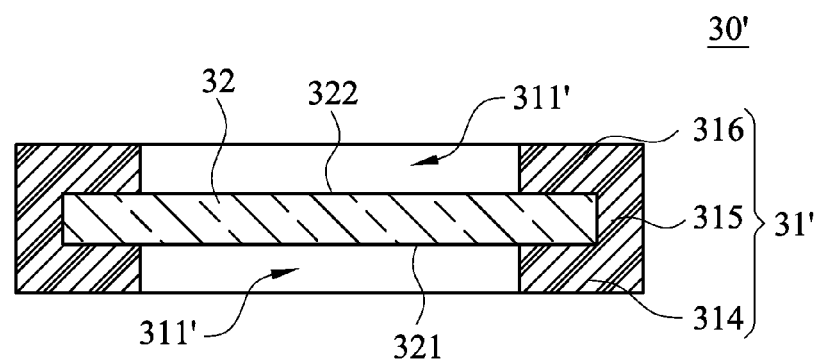
FIG. 4B is a sectional view taken along Line B-B of FIG. 4A.

As can be seen in FIG. 3A, the cover 30' of the image sensor package structure may be configured alternatively. Referring to FIGS. 4A and 4B, the cover 30' may also have a transparent lid 32, whose periphery has been pre-encapsulated by a plastic sheet 31' through a process of injection molding. The plastic sheet 31' may be made of a heat-resistant plastic material or liquid crystal polyester (LCP).

Figure 4C:
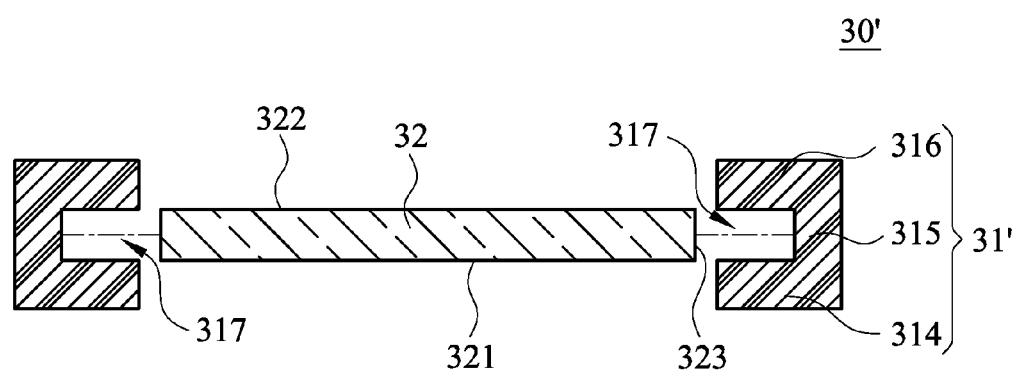
FIG. 4C is an exploded schematic drawing of the cover according to the present invention.

Referring to FIGS. 4B and 4C, the plastic sheet 31' has a first board 314, a second board 315, and a third board 316. Both the first board 314 and the third board 316 are centrally formed with an opening 311'. The second board 315 extends vertically from peripheral edges of the first board 314 so that the second board 315 has a top held over the first board 314, and the third board 316 extends transversely inward the plastic sheet 31' from the top of the second board 315 so as to be parallel with the first board 314. As a result, the first board 314, the second board 315 and the third board 316 jointly define a recess 317.

According to FIGS. 4B and 4C, a periphery of the transparent lid 32 is fittingly received in the recess 317, so that the plastic sheet 31' encapsulates a lateral surface 323, and peripheries of the seventh surface 321 as well as the eighth surface 322 of the transparent lid 32. Consequently, the transparent lid 32 is peripherally covered by the plastic sheet 31' or, from another aspect, the eighth surface 322 of the transparent lid 32 is additionally provided with an encompassing third board 316. Thereby, an invasion path of moisture to the chip 20 is extended, and the image-sensing effect of the image sensor package structure can be ensured against moisture, thus effectively improving the reliability of the image sensor package structure.

As shown in FIG. 3A, the first board 314 is adhered to the fourth surface 22 of the chip 20 through a third adhesive 70, which is also arranged between the sensitization area 221 and the second conductive contacts 222 of the chip 20 without covering the sensitization area 221 and adversely affecting the light sensing function of the sensitization area 221. Moreover, since the third adhesive 70 is applied along a periphery of the sensitization area 221 and corresponding to the bottom of the first board 314 in shape, it serves to firmly adhere the plastic sheet 31' to the fourth surface 22 of the chip 20, so that the sensitization area 221 can be sealed in the air cavity 33 defined between the plastic sheet 31' and the transparent lid 32.

Since the first board 314 between the transparent lid 32 and the third adhesive 70 has a certain thickness, it props up the transparent lid 32 and acts as a barricade between the chip 20 and the transparent lid 32, so as to give a substantial distance between the transparent lid 32 and the sensitization area 221 of the chip 20, thereby increasing the air cavity 33 in volume. The enlarged air cavity 33 and increased distance between the transparent lid 32 and the chip 20 reduce the frequency of ghost images from multi-refraction and multi-reflection of light that otherwise may be caused by an insufficient distance between the transparent lid 32 and the chip 20, thus ensuring the image-sensing effect of the image sensor package structure.

Figure 3B:
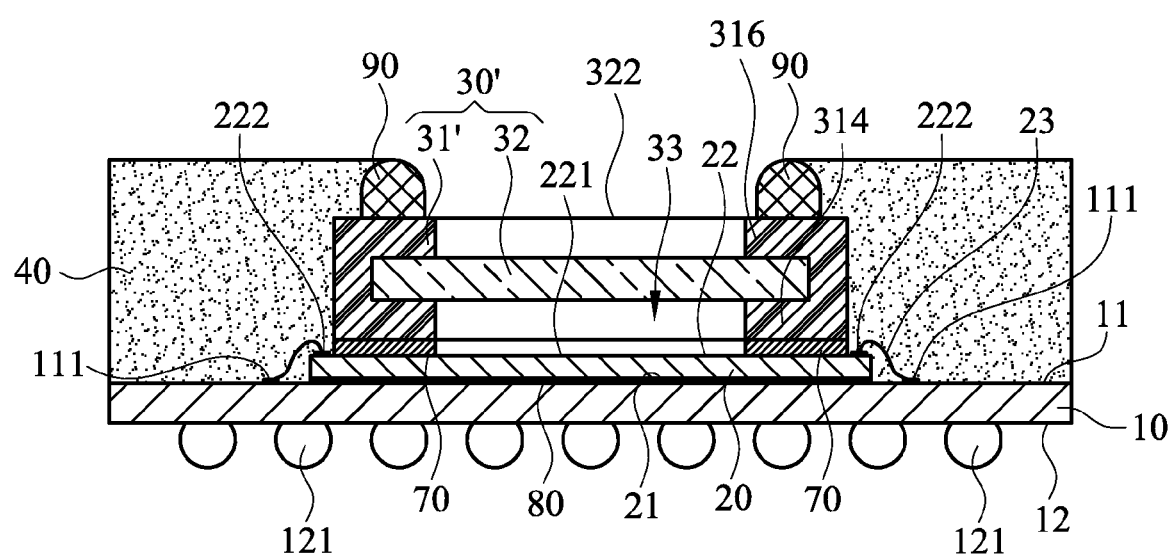
FIG. 3B is a sectional view of an image sensor package structure with a large air cavity according to a fourth embodiment of the present invention.
Figure 3C:
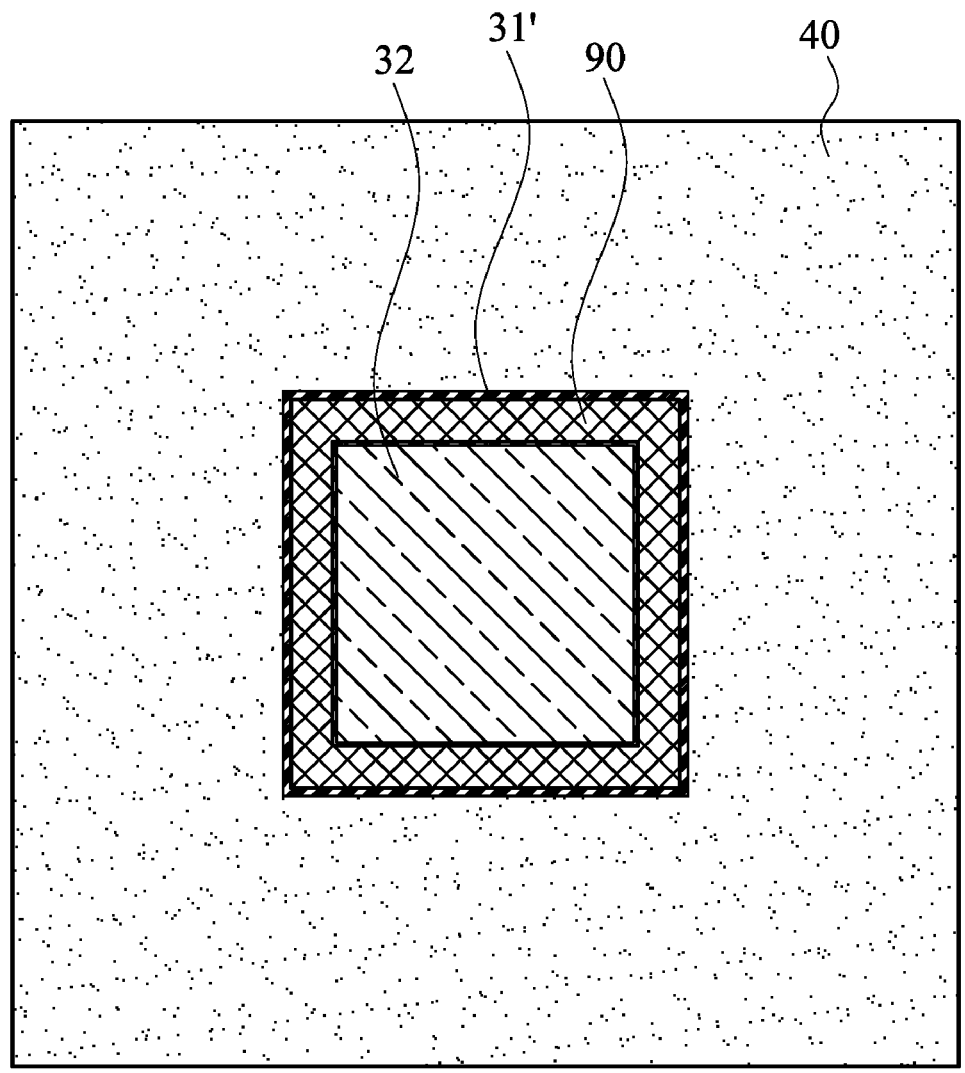
FIG. 3C is a top view of the image sensor package structure of FIG. 3B.

Referring to FIGS. 3B and 3C, a dam 90 (as can be seen in FIG. 3C) may be set along a periphery of an upper surface of the third board 316 of the plastic sheet 31', so that when the package material 40 is settled on the substrate 10 by using a mold for molding, the dam 90 comes to abut against an inner surface of the mold and forms a barricade (not shown). Thus, when the package material 40 is poured into a mold cavity of the mold, the dam 90 serves to stop the package material 40 outside the transparent lid 32 from overflowing to a central portion of the eighth surface 322 of the transparent lid 32. Meantime, since the dam 90 serves to support the mold placed thereon, the direct contact between the mold and the third board 316 of the cover 30' is eliminated, so as to protect the cover 30' from damage.

In addition, when the image sensor package structure is made by molding, the package material 40 in use is mold compound, which is more inexpensive than liquid compound. As a result, the material costs for making the image sensor package structure are significantly reduced. Also, a transfer molding process may be used for forming the mold compound and significantly shorten the cycle time, thus improving the throughput and in turn reducing the overall manufacturing costs.

Figure 5A:
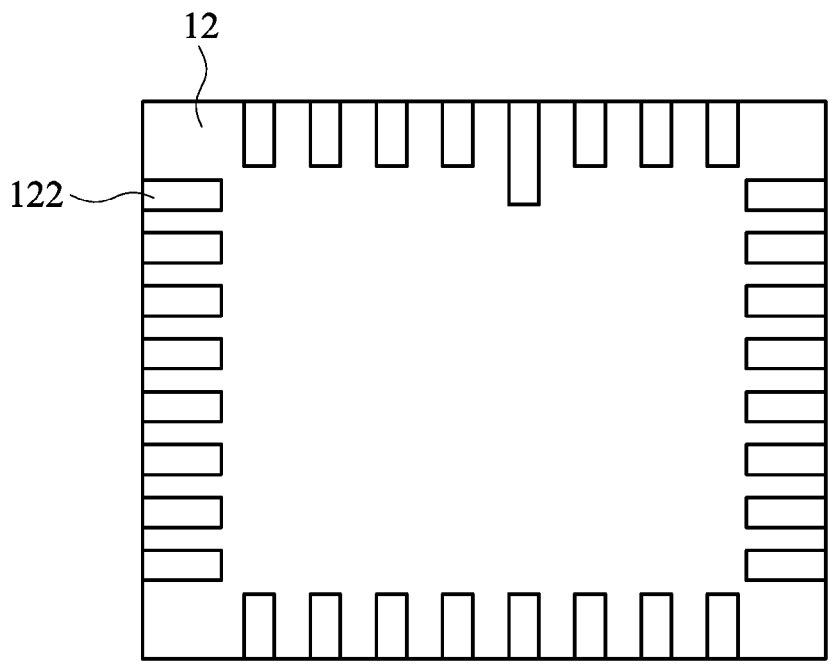
FIG. 5A is a schematic drawing showing the second surface of the substrate provided with soldering pads according to one aspect of the present invention.
Figure 5B:
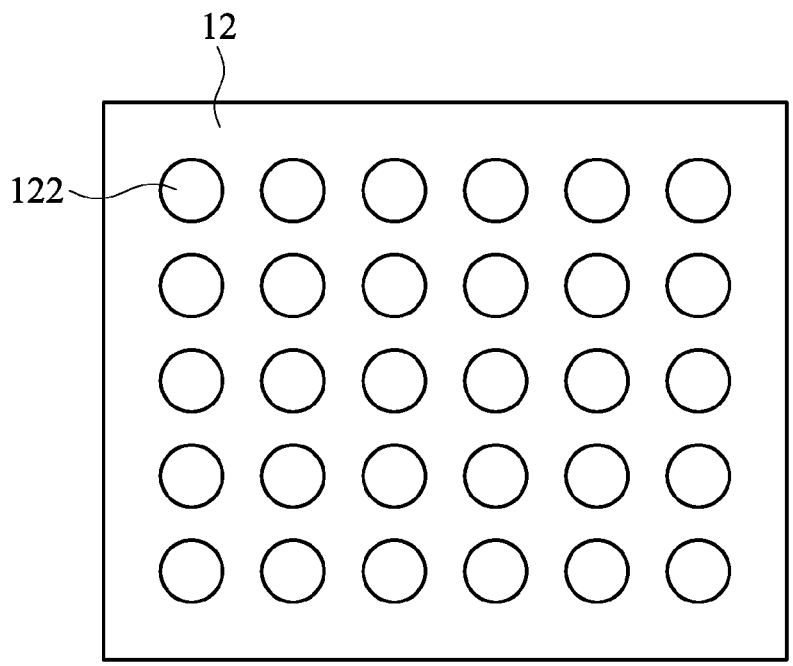
FIG. 5B is a schematic drawing showing the second surface of the substrate provided with soldering pads according to another aspect of the present invention.

Furthermore, referring to FIGS. 5A and 5B, in addition to the solder balls 121, soldering pads 122 may be also provided on the second surface 12 of the substrate 10. The soldering pads 122 are electrically connected with the inner circuit structure of the substrate 10 so as to electrically connect the soldering pads 122 with the first conductive contacts 111 on the first surface 11, thereby allowing the image sensor package structure to be electrically connected with external circuit devices through the soldering pads 122. Preferably, the soldering pads 122 may be arranged along a periphery of the second surface 12 (as shown in FIG. 5A), to surround the second surface 12 or may be arranged as an array (as shown in FIG. 5B).

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. An image sensor package structure with a large air cavity, the image sensor package structure comprising:
   a substrate having:
   a first surface formed with a plurality of first conductive contacts; and
   a second surface;
   a chip having:
   a third surface bound with the first surface;
   a fourth surface including a sensitization area; and
   a plurality of second conductive contacts surrounding the sensitization area and electrically connected with the first conductive contacts;
   a cover having:
   a plastic sheet adhered to the fourth surface; and
   a transparent lid combined with the plastic sheet to provide a covering over the sensitization area and to define the air cavity over the sensitization area; and
   a package material deposited on the substrate to encapsulate peripheries of the chip and the cover;
   wherein the plastic sheet has a first board adhered to the fourth surface, a second board extending vertically from peripheral edges of the first board, and a third board extending transversely toward a center of the plastic sheet from a top of the second board so that a recess is defined by the first board, the second board, and the third board, and a periphery of the transparent lid is received in the recess.

2. The image sensor package structure of claim 1, wherein the substrate is a circuit substrate.

3. The image sensor package structure of claim 1, wherein the chip is a CMOS (Complementary Metal Oxide Semiconductor) image sensor chip or a CCD (Charge-Coupled Device).

4. The image sensor package structure of claim 1, wherein the second conductive contacts are electrically connected with the first conductive contacts through metal conducting wires formed by wiring.

5. The image sensor package structure of claim 1, wherein the sensitization area is formed by a plurality of photosensitive elements.

6. The image sensor package structure of claim 1, wherein the plastic sheet is made of liquid crystal polyester or a heat-resistant plastic material.

7. The image sensor package structure of claim 1, wherein the plastic sheet and the transparent lid are combined by means of injection molding.

8. The image sensor package structure of claim 1, wherein the transparent lid has a seventh surface, an eighth surface, and a lateral surface, with the recess encapsulating the lateral surface and peripheries of the seventh surface and the eighth surface.

9. The image sensor package structure of claim 1, further comprising a dam that is arranged along a periphery of an upper surface of the third board.

10. The image sensor package structure of claim 9, wherein the package material is applied to the peripheries of the chip, the cover, and the dam through a coating or forming process.

11. The image sensor package structure of claim 1, wherein the package material is a liquid compound or a mold compound.

12. The image sensor package structure of claim 1, further comprising a plurality of solder balls or a plurality of soldering pads, which are settled on the second surface and electrically connected with the first conductive contacts through a circuit structure in the substrate.

13. The image sensor package structure of claim 12, wherein the soldering pads are arranged along a periphery of the second surface to surround the second surface or are arranged as an array.

* * * * *